(12) United States Patent
Moriuchi et al.

(10) Patent No.: US 8,373,091 B2
(45) Date of Patent: Feb. 12, 2013

(54) METHOD OF MANUFACTURING A CONTACT

(75) Inventors: Hiroyuki Moriuchi, Tokyo (JP); Hideo Omori, Tokyo (JP); Haruki Shimizu, Tokyo (JP)

(73) Assignee: DDK, Ltd., Tokyo (JP)

( * ) Notice: Subject to any disclaimer, the term of this patent is extended or adjusted under 35 U.S.C. 154(b) by 1303 days.

(21) Appl. No.: 12/064,530

(22) PCT Filed: Aug. 23, 2006

(86) PCT No.: PCT/JP2006/317025
§ 371 (c)(1),
(2), (4) Date: May 20, 2008

(87) PCT Pub. No.: WO2007/024005
PCT Pub. Date: Mar. 1, 2007

(65) Prior Publication Data
US 2009/0149088 A1    Jun. 11, 2009

(30) Foreign Application Priority Data
Aug. 23, 2005 (JP) .................. 2005-241086

(51) Int. Cl.
*B23K 26/38* (2006.01)
*H01R 43/16* (2006.01)
*H01R 13/03* (2006.01)
*H05K 3/34* (2006.01)

(52) U.S. Cl. .................. 219/121.69; 219/121.85

(58) Field of Classification Search ............ 219/121.66, 219/121.85, 121.68, 121.69, 121.76, 121.77; 439/876, 886, 887
See application file for complete search history.

(56) References Cited

U.S. PATENT DOCUMENTS
5,093,987 A * 3/1992 Scholz ............................ 29/860
(Continued)

FOREIGN PATENT DOCUMENTS
JP    08213070    2/1996
(Continued)

OTHER PUBLICATIONS
Machine translation of Japant Patent Document No. 2004-152,559, Jul. 2012.*
(Continued)

*Primary Examiner* — Geoffrey S Evans
(74) *Attorney, Agent, or Firm* — Procopio, Cory, Hargreaves & Savitch LLP

(57) ABSTRACT

A microcontact according to the invention is less than 10 mm in length and composed of a conductive basis material, a base surface treatment layer formed thereon, and an upper surface treatment layer, and includes a contact portion, a terminal portion, and an intermediate portion formed over its entire circumference with exposed oxide surfaces of the base surface treatment layer. The exposed oxide surfaces are formed by irradiating the front and rear surfaces of the contact with laser beams at respective predetermined inclined angles to remove the upper surface treatment layer and simultaneously to oxidize the narrow base surface treatment layer exposed by the removal of the upper surface treatment layer. In this manner, the exposed oxide surfaces can be formed with a high accuracy in a simple manner for stopping solder rise at a predetermined position when the terminal portion of the microcontact is jointed to a substrate by soldering.

5 Claims, 15 Drawing Sheets

U.S. PATENT DOCUMENTS

| | | | | |
|---|---|---|---|---|
| 5,957,736 A | * | 9/1999 | Moriuchi et al. | 439/876 |
| 2001/0030002 A1 | * | 10/2001 | Zheng et al. | 148/565 |
| 2002/0142667 A1 | * | 10/2002 | Reed et al. | 439/676 |
| 2005/0103761 A1 | * | 5/2005 | Miki et al. | 219/121.69 |

FOREIGN PATENT DOCUMENTS

| | | |
|---|---|---|
| JP | 8-213070 A | 8/1996 |
| JP | 10-247535 A | 9/1998 |
| JP | 2004152559 A | 5/2004 |
| JP | 2004152750 A | 5/2004 |

OTHER PUBLICATIONS

Machine translation of Japan Patent Document No. 10-247,535, Jul. 2012.*

Machine translation of Japan Patent Document No. 8-213,070, Jul. 2012.*

European Search Report dated Dec. 22, 2011 for Patent Application No. EP06797002.0.

Chinese Office Action for counterpart Chinese Application No. 2006800307494 dated May 8, 2009.

* cited by examiner (a)

×150

(b)

×500

(a)

×150

(b)

×500

(a)

Sagging Surface Before Soldering (b)

Sagging Surface After Soldering (a)

Sagging Surface Before Soldering (b)

Sagging Surface After Soldering

Magnification Ratio :
1,000 times (Laser Microscope)

METHOD OF MANUFACTURING A CONTACT

TECHNICAL FIELD

This invention relates to a microcontact (particularly, width of its intermediate portion is 5 mm or less), a method for producing the microcontact, and an electronic component, and more particularly to a technique for forming exposed oxide surfaces in the intermediate portion of a contact with a high accuracy in a simple manner, the exposed oxide surfaces enabling solder rise to be stopped at a predetermined position when soldering the terminal portion of the microcontact to a substrate.

BACKGROUND ART

For example, when contacts of an electronic component such as an electrical connector and lead frame are electrically connected to circuit terminals of a wiring substrate, it is common to connect terminal portions of the contacts to the wiring substrate by soldering.

The contacts described above are usually formed by punching, bending, or the like from a metal plate, and their conductive basis material consists of a contact portion, an intermediate portion and a terminal portion and is plated with conductive metals suitable for the respective portions of the basis material.

For example, in general, the surface of the contact portion of the basis material is plated for electrical contact in consideration of corrosion resistance, conductive property and the like, while the terminal portion formed contiguously to the contact portion is plated with a metal suitable for subsequent soldering (referred to hereinafter as "plating for soldering") in order to perform soldering (jointing) securely and effectively in a post-process, in other words to cause the terminal portion to have affinity (wetting) with the solder.

The plating for soldering is usually solder plating, but there may be gold (Au) plating, palladium (Pd)-nickel (Ni) plating, palladium plating, tin (Sn) plating, and the like.

By the way, when the terminal portion of a contact is jointed to a substrate by soldering, there is often a tendency to cause problems that molten solder on the side of the substrate or molten solder of solder plating applied to the terminal portion itself would rise or climb up under a wetting condition beyond the position of the terminal portion of the contact all the way to the contact portion of the contact with the aid of capillary action due to a shape of the contact, and the molten solder would flow so as to contaminate the contact portion.

In order to prevent the solder from rising, certain methods have been employed, for example, in that a tape is used for masking a portion of a contact plated with nickel which requires a barrier for the nickel plating layer, or a resin or the like is used for mechanically masking a portion of the nickel plated layer where a barrier is required and the plating is effected.

However, the former method requires a tape having some width so that this method is not suitable for the microcontact according to the invention needing to form an extremely narrow barrier for the nickel plating layer. In addition, a particular tape has to be used in the former method so that a manufacturing cost would go up.

Moreover, the latter method must necessarily make a mechanical mask for each product. Therefore, in addition to increase in production cost, positional control between the contact and the mask must be precisely carried out so that it becomes difficult to increase the speed of plating to provide a new problem to be solved.

As a further method for preventing the solder from rising due to wetting, there is, for example, a method disclosed in patent literature 1 proposed by the applicant of the present application and opened, this disclosure clarifying that it is useful to provide a nickel oxide layer in the intermediate portion positioned between a contact portion and a terminal portion. According to the method for forming a nickel oxide layer described in the patent literature 1, after a nickel layer has been provided as a base plating layer, the contact portion is plated as plating for electric contact and the terminal portion is plated as plating for soldering, providing a predetermined spacing (practically in the order of 0.3 to 2.8 mm) therebetween, and thereafter oxidation treatment of the nickel layer exposed between the contact portion and the terminal portion is carried out to form a nickel oxide layer.

Patent Literature 1: Japanese Patent Application Opened No. H10-247,535 (1998).

With the method for forming the nickel oxide layer described in the patent literature 1, however, the plating for electrical contact and plating for soldering must be carried out while the nickel layer is exposed with the predetermined spacing. Particularly, setting or positioning with a high accuracy is required for forming a nickel oxide layer with a high accuracy on a microcontact having a width less than 5 mm at the intermediate portion so that there is a tendency for equipment cost to be increased. Further the method disclosed in the patent literature 1 requires an additional independent process for oxidizing the nickel layer.

DISCLOSURE OF THE INVENTION

It is an object of the invention to provide a microcontact enabling exposed oxide surfaces to be formed in the intermediate portion of the microcontact with a high accuracy in a simple manner for stopping solder rise at a predetermined position when the terminal portion of the microcontact is jointed to a substrate by soldering and further to provide a method for producing the microcontact and an electronic component.

Solution for the Task

In order to accomplish the object described above, in a microcontact of very small size composed of a conductive basis material, a base surface treatment layer formed thereon, and an upper surface treatment layer, and including a contact portion adapted to electrically contact a mating connector, a terminal portion to be electrically connected to other substrate by soldering, and an intermediate portion connecting between these contact portion and terminal portion, the intermediate portion being formed over its entire circumference with exposed oxide surfaces of said base surface treatment layer, according to the invention said exposed oxide surfaces are formed by using a pair of laser devices separately arranged at front and rear surface sides of the contact respectively, and irradiating said front surface and one width side surface of the contact from one of the laser devices at predetermined inclined angles, and irradiating said rear surface and another width side surface of the contact from other laser device at predetermined inclined angles so as said upper surface treatment layer from entire circumference at middle portion of the contact and simultaneously to oxidize the base surface treatment layer of a narrow width exposed by the removal of the upper surface treatment layer.

It is preferable that the width of said intermediate portion between said contact portion and said terminal portion is 5 mm or less.

Preferably, the width of the exposed oxide surfaces in the intermediate portion is within a range of 0.1 to 1.0 mm.

Further, it is more preferable that the base surface treatment layer is a nickel plating layer, and the upper surface treatment layer includes a gold plating layer over the contact portion, a gold plating layer over the intermediate portion, and a solder plating layer or a gold plating layer over the terminal portion.

Furthermore, it is preferable that said predetermined inclined angles are each within a range enabling two surfaces consisting of the surface and the side face of the terminal portion to be irradiated with the laser.

It is further required that the irradiation of said laser beams is performed by laser devices in pair which are arranged spaced apart from each other on the sides of front and rear surfaces of the contact, respectively, in a manner that the laser beam from one laser device irradiates the front surface and one side face of said contact and the laser beam from the other laser device irradiates the rear surface and the other side face of said contact.

Moreover, the electronic component according to the invention comprises a plurality of said contacts, and a housing arranging said contacts with a predetermined interval.

Further, the method for producing said microcontact according to the invention comprises a surface covering step of successively forming a base surface treatment layer and an upper surface treatment layer on surfaces of a conductive basis material, and an exposed oxide surface forming step of removing the upper surface treatment layer and simultaneously oxidizing the base surface treatment layer of a narrow width exposed by the removal of the upper surface treatment layer to form exposed oxide surfaces by irradiating front and rear surfaces of an intermediate portion of the microcontact with laser beams at predetermined inclined angles, respectively.

Effect of the Invention

According to the invention, exposed oxide surfaces can be formed in the intermediate portion of a microcontact with a high accuracy in a simple manner by simultaneously performing removal of an upper surface treatment layer and oxidation of a narrow base surface treatment layer exposed by the removal of the upper surface treatment layer by irradiating the front and rear surfaces of the microcontact with laser beams at predetermined inclined angles, respectively, thereby easily producing microcontacts (particularly less than 10 mm in full length) and securely preventing the solder rise.

BRIEF DESCRIPTION OF THE DRAWINGS

The patent or application file contains at least one drawing executed in color. Copies of this patent or patent application publication with color drawings will be provided by the Office upon request and payment of the necessary fee.

BEST MODE FOR CARRYING OUT THE INVENTION

The best mode for carrying out the invention will then be explained with reference to the drawings hereinafter.

Figure 1:
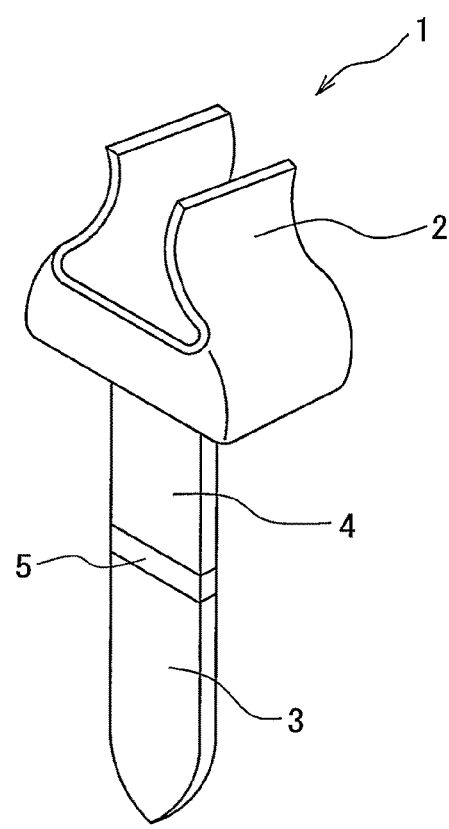
FIG. 1 is a perspective view illustrating a contact according to the invention.

FIG. 1 is a perspective view illustrating a typical microcontact according to the invention.

The contact 1 shown in FIG. 1 is a microcontact having a full length of 10 mm or less, particularly having a width of 5 mm or less at its intermediate portion, and formed by an electrically conductive basis material, a base surface treatment layer formed thereon, and an upper surface treatment layer formed thereon. The microcontact 1 comprises a contact portion 2 adapted to electrically contact a mating connector, a terminal portion 3 to be electrically connected to another substrate 8 by soldering, and an intermediate portion 4 connecting between these contact portion 2 and terminal portion 3.

The conductive basis material may be formed from a metal plate, for example, such as phosphor bronze and beryllium copper as an integral body by punching, bending and the like.

It is preferable for significantly achieving the effects of the invention that the base surface treatment layer is a nickel plating layer, and the upper surface treatment layer is composed of gold plating layers over the contact portion 2 and the intermediate portion 4, and a solder plating layer or gold plating layer over the terminal portion 3. However, these surface treatment surfaces are not to be limited to such a combination.

Moreover, the intermediate portion 4 is formed with exposed oxide surfaces 5 of a narrow width over its entire circumference by exposing and oxidizing the base surface treatment layer as a solder rise preventing layer.

And a principal aspect of the construction of the contacts according to the invention lies in the technique for forming the exposed oxide surfaces 5. More specifically, a surface 1a and a rear surface 1b of a contact 1 are irradiated with laser beams at predetermined angles θa and θb, respectively, so that the upper surface treatment layer is removed and the base surface treatment layer of a narrow width exposed by the removal of the upper surface treatment layer is oxidized simultaneously, thereby forming the exposed oxide surfaces 5 with a high accuracy in a simple manner.

Figure 2:
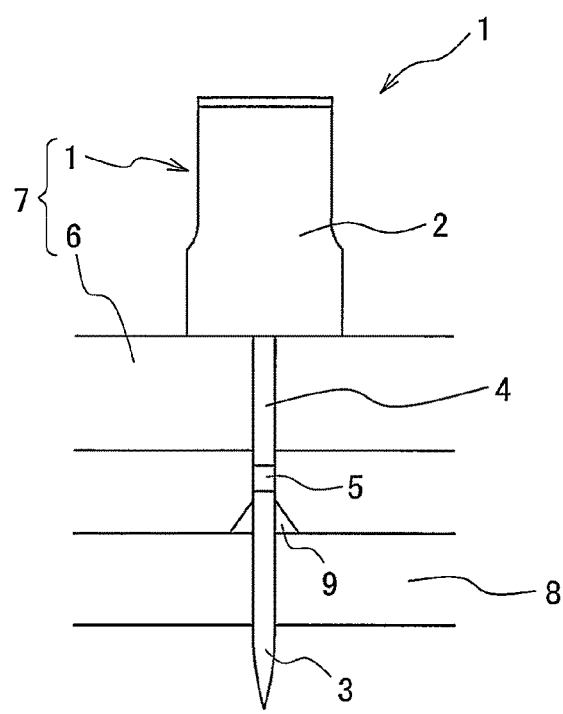
FIG. 2 is a sectional view illustrating a state of an electrical connector according to the invention connected to another substrate by soldering.

FIG. 2 illustrates, by way of example, an electrical connector 7 as an electronic component according to the invention comprising a plurality of contacts 1 and a housing 6 arranging the contacts 1 at a predetermined interval under a condition that the electrical connector 7 is electrically connected to another substrate 8 by soldering 9.

Figure 3:
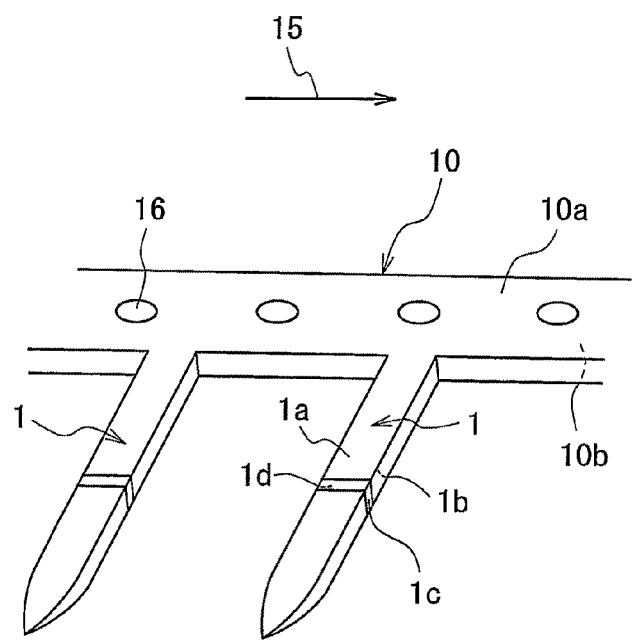
FIG. 3 is a perspective view of a band-shaped member of a plurality of integrally connected contacts.
Figure 4:
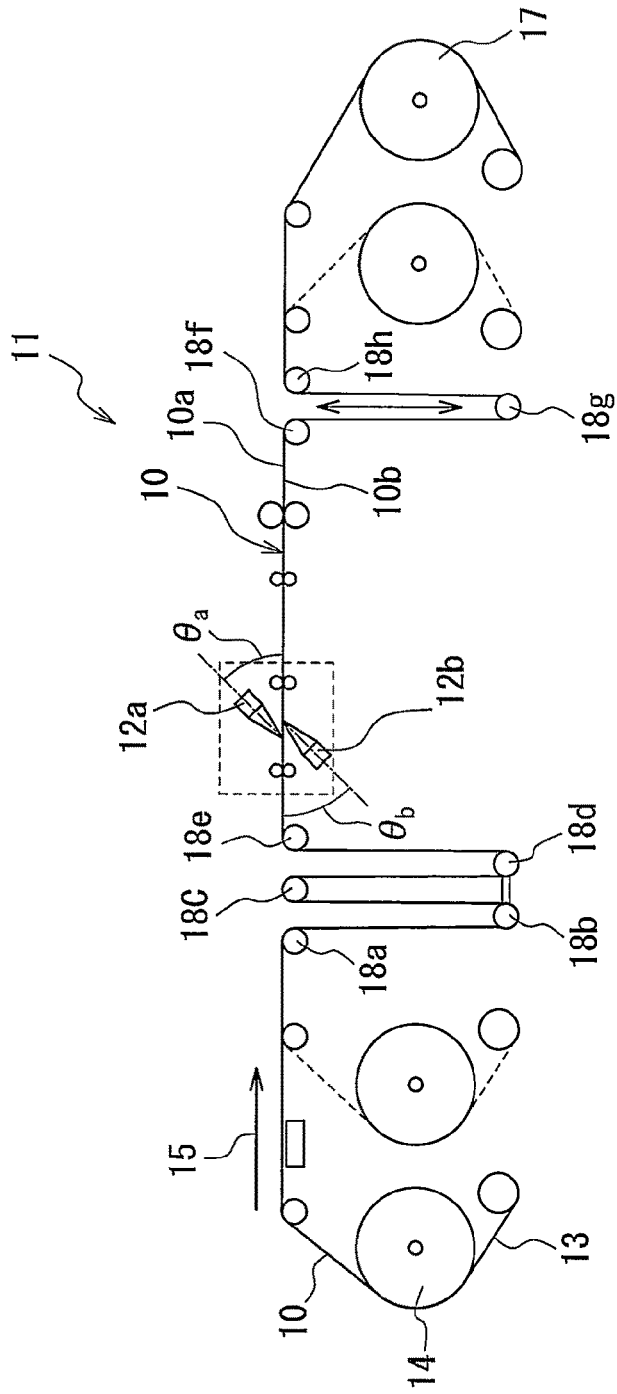
FIG. 4 is a schematic view of a working device for forming exposed oxide surfaces by irradiating with laser beams the respective contacts of the band-shaped member shown in FIG. 3.

FIG. 3 is a perspective view of a plurality of contacts 1 integrally connected in a state of a band-shaped member 10, which have been formed with the exposed oxide surfaces 5. Moreover, FIG. 4 illustrates one example of a working device 11 for forming the exposed oxide surfaces 5 by irradiating the respective contacts 1 of the band-shaped member 10 with laser beams. The working device 11 comprises laser devices in pairs (a pair of laser devices 12a and 12b in the case of FIG. 4) arranged spaced apart from each other on the sides of front and rear surfaces 1a and 1b of the contact 1, respectively.

A procedure for forming the exposed oxide surfaces 5 of the respective contacts 1 by the use of the working device 11 shown in FIG. 4 will be explained. A band-shaped member 10 formed with base surface treatment layers (for example, base nickel plate layers) and upper surface treatment layers (for example, gold plate layer) on the conductive basis material has previously been wound together with an interlayer paper (release paper) 13 on a reel. The band-shaped member 10 is fed from the reel 14 into the working device 11, while being separated from the interlayer paper 13. As an feeding method for the band-shaped member, for example, the band-shaped member 10 is provided with a plurality of guide holes 16 as shown in FIG. 3 or guide projections, while on the side of the working device 11 there are provided projections or holes adapted to be connected to the guide holes 16 or guide projections, thereby enabling the band-shaped member to be fed in the feeding direction 15 shown in FIG. 4.

Subsequently, the band-shaped member 10 being fed passes between the pair of laser devices 12a and 12b and then wound up onto a winding reel 17.

These laser devices 12a and 12b irradiate the front and rear surfaces of the contacts with laser beams at the predetermined inclined angles θa and θb of ranges enabling the both the front and rear surfaces of the respective terminal portions of the contacts to be irradiated with laser beams at a time. In other words, the laser devices 12a and 12b are so arranged that one laser device 12a irradiates the surface 1a and one side face 1c of the contact 1 with the laser beam and the other laser device 12b irradiates the rear surface 1b and the other side face 1d of the contact 1. In this way, the entire circumference (four surfaces) of the contact 1 can be irradiated by the laser beams.

Preferably, said predetermined inclined angles θa and θb are within ranges enabling the two surfaces, that is, the surface and the side face of the terminal portion to be irradiated with laser beams, specifically they are 5° to 90°. These angles are more preferably within a range of the minimal angle to 45°±5°, at which minimal angle the energy density becomes lower to an extent that the removal (peeling) of the upper surface treatment layer becomes impossible.

All the circumference of the contact can be irradiated with the laser beams in this manner so that the removal of the upper surface treatment layer and the oxidation of the base surface treatment layer exposed by the removal of the upper surface treatment are simultaneously carried out, thereby enabling the formation of the narrow exposed oxide surfaces 5 with a high accuracy in a simple manner.

For confirmation, Japanese Patent Application Opened No. 2004-152,559 discloses a method in that after a basis metal has been plated with nickel as a base layer, the nickel plated surface is plated with gold, and thereafter the laser beam machining is applied to the surface of the part requiring the solder rise prevention so that the base nickel plating layer is exposed, and further discloses the feature of modifying base nickel plating layer and gold plating layer to nickel-gold alloy layer. However, these disclosed features are not for performing the removal of the upper surface treatment layer and the oxidation of the narrow base surface treatment layer exposed by the removal of the upper layer at a time, as is the case with the present invention.

According to the invention, by particularly controlling the energy density of the laser within a predetermined range as a laser irradiation condition, only the upper surface treatment layer (for example, gold plating layer) can be removed and the narrow base surface treatment layer (for example, base nickel plating layer) exposed by the removal of the upper surface treatment layer can be oxidized simultaneously, as a result of which the narrow exposed oxide surfaces 5 can be formed with a high accuracy in a simple manner.

The thickness of the base surface treatment layer, for example, a nickel plating layer is preferably within a range of 0.6 to 1.5 μm, and even more preferably within a range of 0.9 to 1.1 μm, because in the case of the latter range, an applicable range of the energy density of laser becomes advantageously wider when irradiating the layer. This is because in the case of the nickel plating layer being less than 0.6 μm in thickness, it is difficult to expose the nickel plating layer by removing only the upper surface treatment layer by the irradiation of the laser, and because if the thickness of the nickel plating layer is thicker than 1.5 μm, it only contributes to increase of the cost.

In the case that the base surface treatment layer is, for example, a nickel plating layer, the energy density of the laser when irradiating the laser is preferably within a range of 25 to 45 mJ/mm$^2$ in order to avoid the exposure of copper of the basis material.

Figure 5:
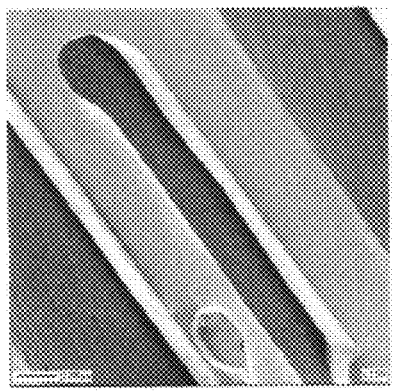
FIG. 5 illustrates photographs (a) (enlarged 150 times) and (b) (enlarged 500 times) when observed the surface of the contact before irradiating its intermediate portion with laser.
Figure 5:
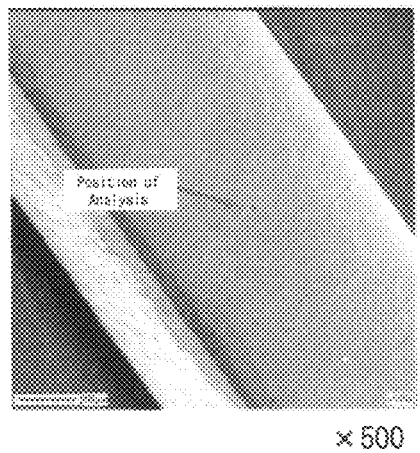
Figure 6:
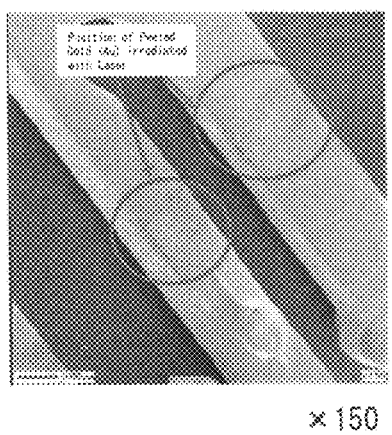
FIG. 6 illustrates photographs (a) (enlarged 150 times) and (b) (enlarged 500 times) when observed the surface of the contact according to the invention after irradiating its intermediate portion of the contact of FIGS. 5(a) and (b) with laser (energy density: 40 mJ/mm$^2$)
Figure 6:
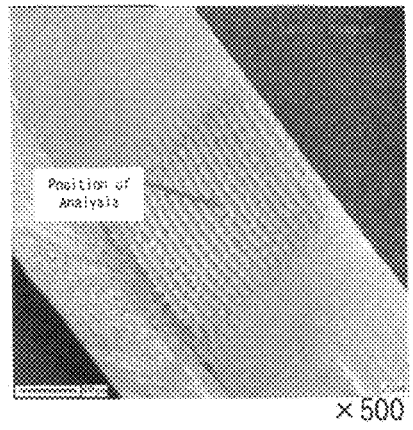
Figure 7:
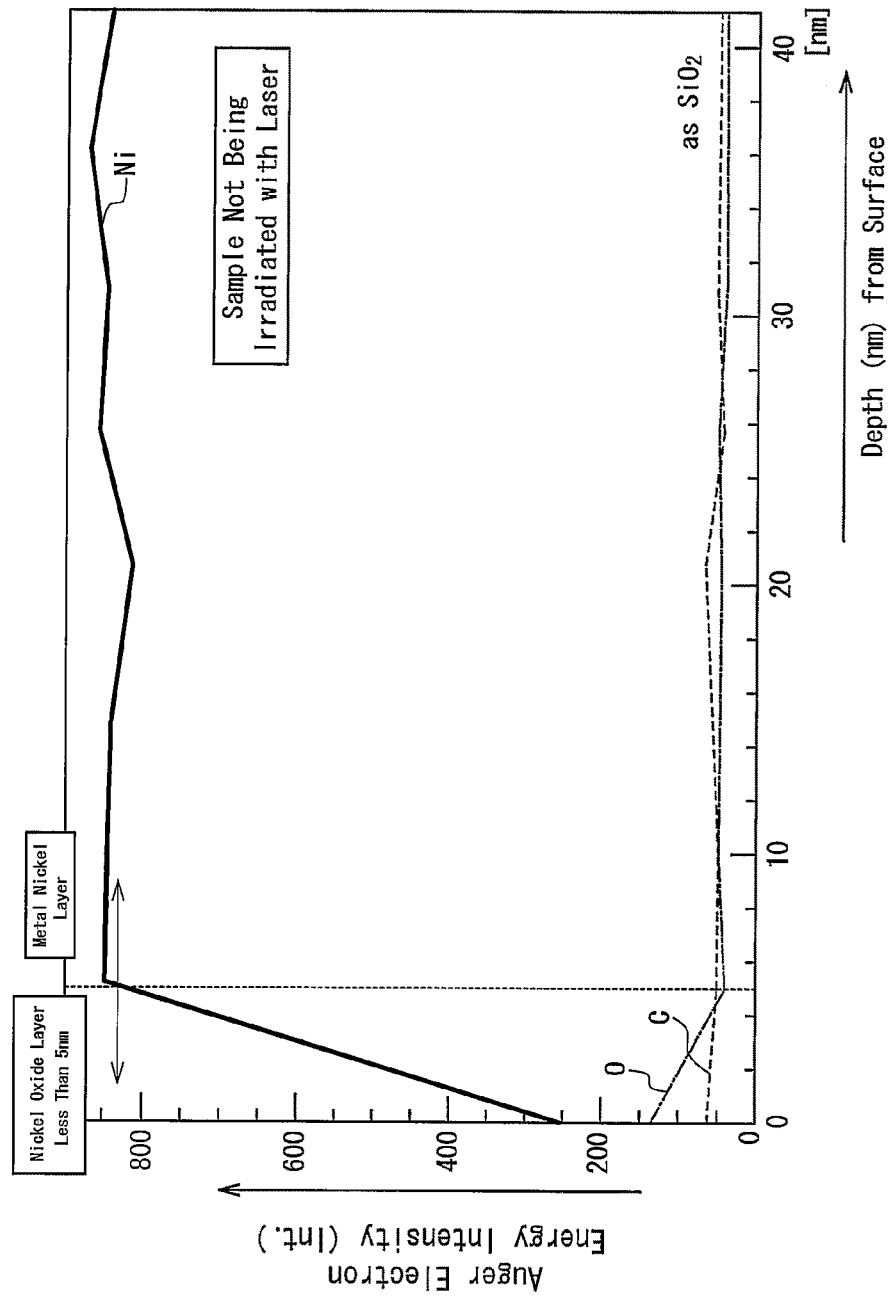
FIG. 7 illustrates results of elemental analysis of the intermediate portion of the contact before irradiating the laser from the surface into the direction of depth by the Auger electron spectroscopy, respectively, corresponding to FIG. 5.
Figure 8:
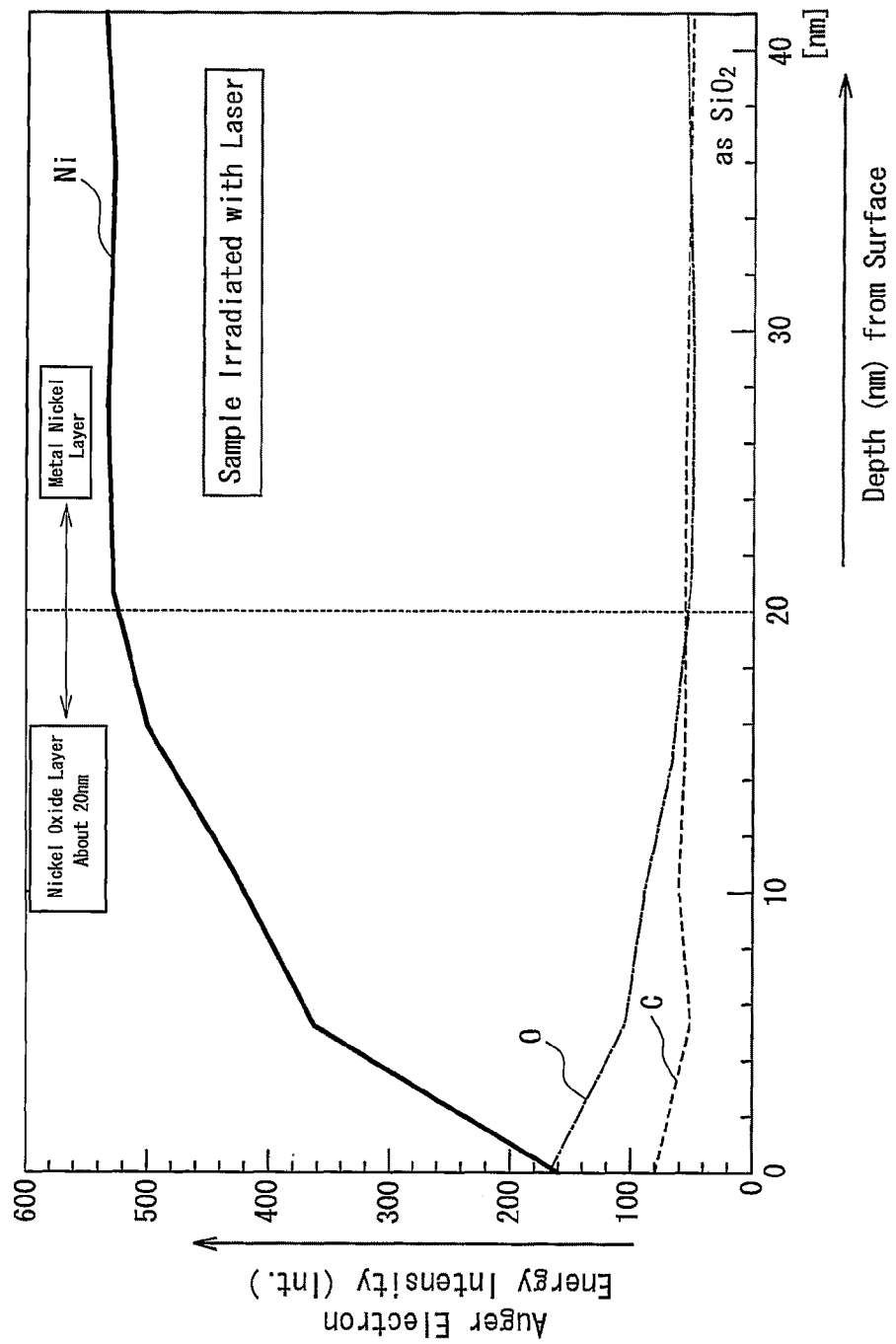
FIG. 8 illustrates results of elemental analysis of the intermediate portion of the contact after irradiating the laser from the surface into the direction of depth by the Auger electron spectroscopy, respectively, corresponding to FIG. 6.

FIGS. 5 (a) and (b) are photomicrographs, enlarged 150 times and 500 times of the surface of an intermediate portion of a contact including a conductive basis material of copper, a base surface treatment layer of a nickel plating layer (thickness: 2 μm), and an upper surface treatment layer of a gold plating layer (thickness: 0.1 μm) before being irradiated with the laser. FIGS. 6 (a) and (b) are photomicrographs, enlarged 150 times and 500 times of the intermediate portion of the contact shown in FIGS. 5 (a) and (b) after being irradiated with the laser (energy density: 40 mJ/mm$^2$). FIGS. 7 and 8 illustrate results of elemental analysis of the intermediate portion of the contact before and after being irradiated with the laser corresponding to those of FIGS. 5 and 6, the analysis carrying out from the surface into the direction of depth by the Auger electron spectroscopy, respectively.

From the results of the elemental analysis shown in FIGS. 7 and 8, there is a nickel (Ni) oxide layer of the order of 5 nm, which can be thought of as a native oxide layer, in the intermediate portion before being irradiated with the laser, while in the intermediate portion after being irradiated with the laser there is a thick nickel (Ni) oxide layer of the order of 20 nm which is about four times the native oxide layer, which indicates that the thick nickel (Ni) oxide layer has been formed by the irradiation of the laser.

Figure 9:
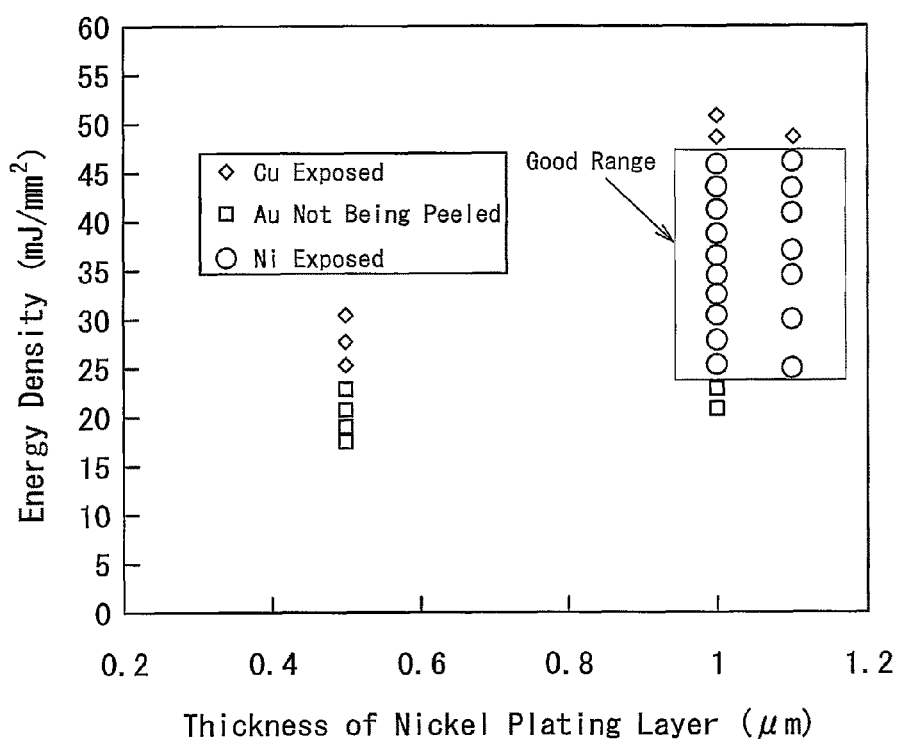
FIG. 9 is a graph plotted by the results of elemental analysis of the surface of a portion radiated with laser and existence or nonexistence of solder rise when soldering, the axis of ordinate indicating energy densities (mJ/mm$^2$) and the axis of abscissa indicating thicknesses (μm) of the nickel plating layers.

FIG. 9 illustrates results of elemental analysis and examination of existence or nonexistence of the solder rise upon soldering for parts of intermediate portions, irradiated with laser with various energy densities, of contacts each including a conductive basis material of copper, a base surface treatment layer of a nickel plating layer of one of various thickness, and an upper surface treatment layer of a gold plating layer (thickness: 0.1 µm). The axis of ordinate indicates energy densities mJ/mm$^2$ of the laser, and the axis of abscissa shows thicknesses (µm) of the nickel plating layers.

From the results shown in FIG. 9, within the range of the nickel plating layer less than 1.1 µm, the thicker the thickness of the nickel plating layer, the wider is the applicable range of the energy density of the laser when irradiating the laser, and with the thickness of the nickel plating layer more than 0.9 µm, the applicable range of the energy density of the laser is substantially constant regardless of thickness of the plating layer.

Figure 10:
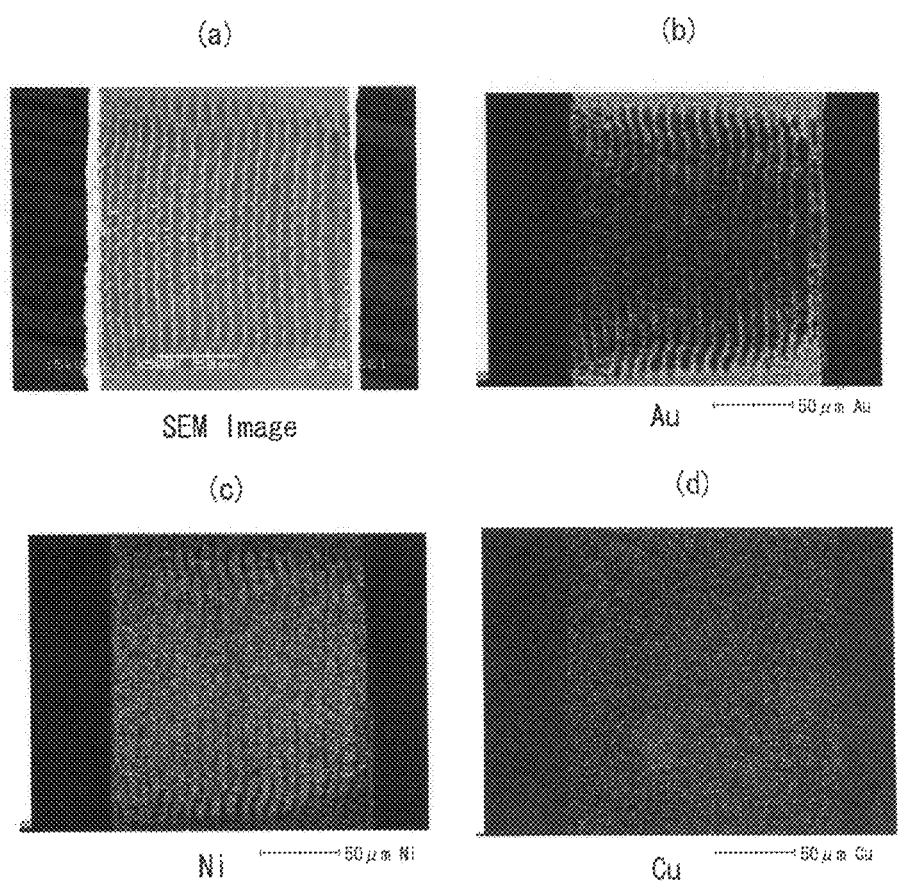
FIG. 10 illustrates (a) an image by a scanning electron microscope (SEM), and (b), (c) and (d) X-ray images of Au, Ni and Cu, respectively, when observed a surface of a contact according to the invention.
Figure 11:
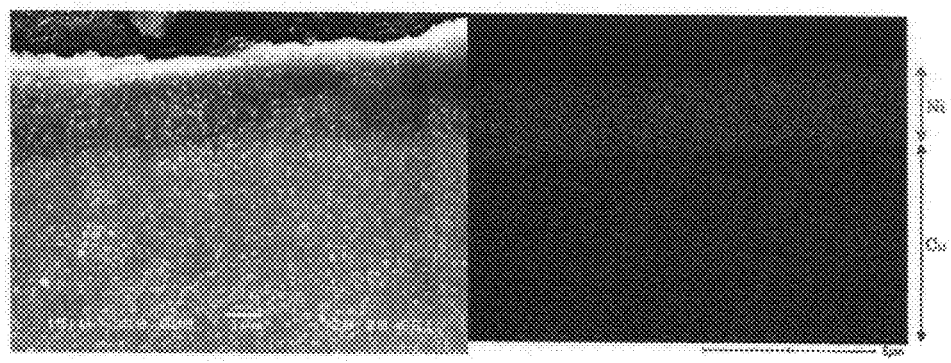
FIG. 11 illustrates (a) an image by the scanning electron microscope (SEM), and (b) X-ray image of a section of the contact of FIG. 10.
Figure 12:
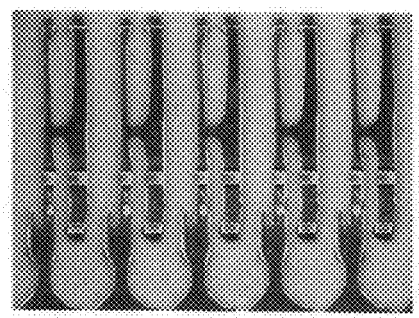
FIG. 12 illustrates photographs of the surface of the contact of FIG. 10 when observed (a) before and (b) after soldering the terminal portion of the contact.
Figure 12:
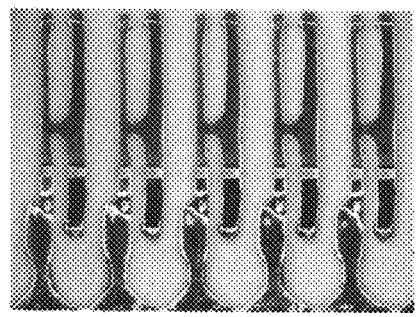

FIG. 10 illustrates (a) an image by a scanning electron microscope (SEM), and (b), (c) and (d) X-ray images of Au, Ni and Cu when observed a surface of a contact according to the invention after irradiating with the laser (energy density: 40 mJ/mm$^2$) the intermediate portion of the contact including a conductive basis material of copper, a base surface treatment layer of a nickel plating layer (thickness: 2 µm), and an upper surface treatment layer of a gold plating layer (thickness: 0.1 µm). FIG. 11 illustrates (a) an image by the scanning electron microscope (SEM), and (b) X-ray image of a section of the contact of FIG. 10. FIG. 12 illustrates photomicrographs of the terminal portion of the contact of FIG. 10 when observed the surface of the contact (a) before soldering and (b) after soldering.

Figure 13:
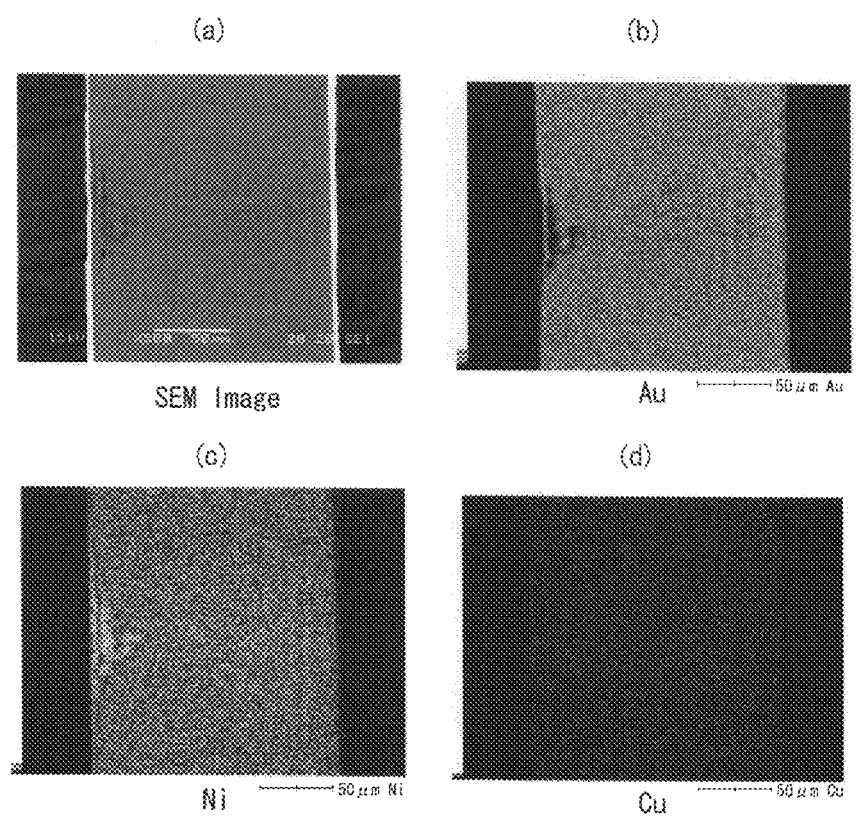
FIG. 13 illustrates (a) an image by a scanning electron microscope (SEM), and (b), (c) and (d) X-ray images of Au, Ni and Cu, respectively, when observed surfaces of contacts of comparative examples.
Figure 14:
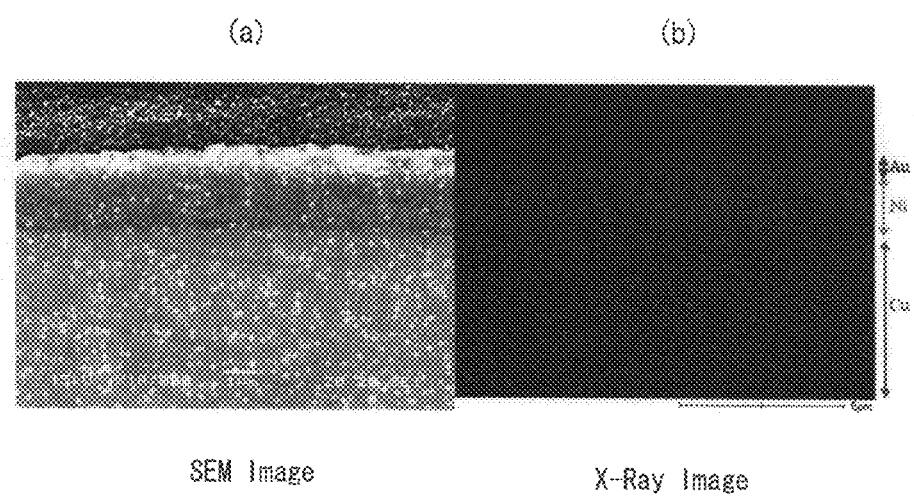
FIG. 14 illustrates (a) an image by a scanning electron microscope (SEM), and (b) X-ray image when observed the section of the contact of FIG. 13.
Figure 15:
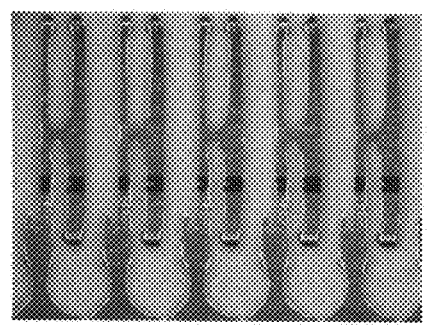
FIG. 15 illustrates photographs when observed the surfaces of the contact of FIG. 13 (a) before and (b) after soldering the terminal portion of the contact.
Figure 15:
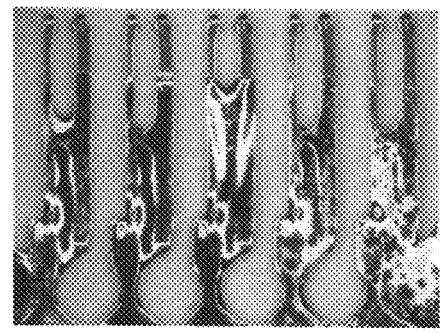

Moreover, FIG. 13 illustrates (a) an image by the scanning electron microscope (SEM), and (b), (c) and (d) X-ray images of Au, Ni and Cu when observed a surface of a contact of comparative examples after irradiating with the laser (energy density: 40 mJ/mm$^2$) the intermediate portion of the contact including a conductive basis material of copper, a base surface treatment layer of a nickel plating layer (thickness: 2 µm), and an upper surface treatment layer of a gold plating layer (thickness: 0.1 µm). FIG. 14 illustrates (a) an image by the scanning electron microscope (SEM), and (b) X-ray image of a section of the contact of FIG. 13. FIG. 15 illustrates photomicrographs of the terminal portion of the contact of FIG. 13 when observed the surface of the contact (a) before soldering the terminal portion and (b) after soldering.

From the results of FIG. 10 (a) to (d), it can be seen that in the surface of the intermediate portion, irradiated with the laser, of the contact according to the invention there is little gold (Au), but nickel (Ni) exists on the entire surface and the copper of the basis material is not exposed. From the results of FIGS. 11 (a) and (b), it can also be seen that the nickel (Ni) layer exists uniformly all over the surface irradiated with the laser.

From the results of soldability shown in FIG. 12, with the contact according to the invention, the solder rise due to wetting is restrained at the position immediately below the laser irradiated surface formed in the intermediate portion of the contact so that the effect preventing the nickel (Ni) oxide layer from rising or climbing due to wetting can be identified.

From the results of FIG. 13 (a) to (d), on the other hand, it can be seen that with the contacts of the comparative examples irradiated with the laser of low energy density, gold (Au) remains attached to the entire surface of the intermediate portion irradiated with the laser. From the results of FIGS. 14 (a) and (b), moreover, it can also be seen that the gold (Au) layer exists uniformly on the entire surface irradiated with the laser, while from the results of soldability in FIG. 15, it is clear that with the contacts of the comparative examples, the solder rise due to wetting may occur over the laser irradiated surface formed in the intermediate portion of the contact all the way to the proximity of the contact portion.

Figure 16:
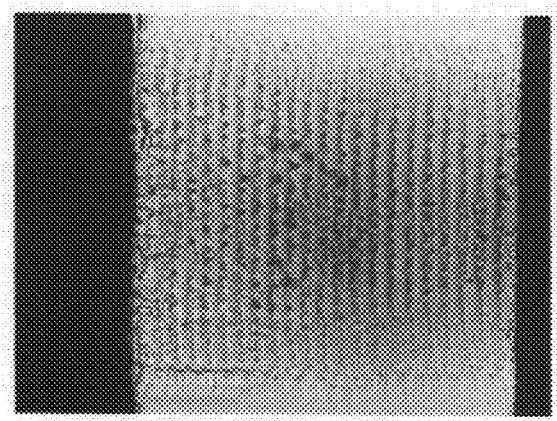
FIG. 16 illustrates a photomicrograph (1,000 times of magnification ratio) of an exposed oxide surface formed on the contact according to the invention by the use of a laser microscope.

Further, FIG. 16 illustrates one example of photomicrographs (magnification ratio: 1,000 times) of the exposed oxide surface 5 (thickness of nickel plating layer: 1 µm, and energy density of laser: 30 mJ/mm$^2$) formed on the contact according to the invention, by the use of the laser microscope.

FIG. 4 illustrates the working device 11 provided with a plurality of guide rollers 18a to 18h between the reels 14 and 17 for adjusting the tensile force in the band-shaped member 10 or for other purposes. However, such a construction may be suitably selected when required, as a further embodiment of the invention.

Although the invention has been described with reference to one example of its embodiment, it will be understood that various changes and modifications may be made in the invention without departing from the spirit and scope of the appended claims.

INDUSTRIAL APPLICABILITY

According to the invention, exposed oxide surfaces can be formed in the intermediate portion of a contact with a high accuracy in a simple manner by irradiating the front and the rear surfaces with laser beams at predetermined angles, respectively, to remove an upper surface treatment layer and oxidize a narrow base surface treatment layer exposed by the removal of the upper surface treatment layer simultaneously.

The invention claimed is:

1. A method of manufacturing a contact, comprising:
successively forming a base surface treatment layer and an upper surface treatment layer on surfaces of a conductive basis material, and
removing the upper surface treatment layer; and
with the removal of the upper surface treatment layer, substantially simultaneously oxidizing the base surface treatment layer of a narrow width exposed by the removal of the upper surface treatment layer to form exposed oxide surfaces, by irradiating front and rear surfaces of an intermediate portion of the contact with laser beams at predetermined inclined angles, respectively.

2. The method of claim 1, wherein the width of the intermediate portion is 5 mm or less.

3. The method of claim 1, wherein the width of the exposed oxide surfaces in the intermediate portion is within a range of 0.1 to 1.0 mm.

4. The method of claim 1, wherein the base surface treatment layer is a nickel plating layer, and the upper surface treatment layer includes a gold plating layer over the contact portion, a gold plating layer over the intermediate portion, and a solder plating layer or a gold plating layer over the terminal portion.

5. The method of claim 1, wherein said predetermined inclined angles are each within a range enabling two surfaces consisting of the surface and the side face of the terminal to be irradiated at once by the laser beams.

* * * * *